US009786500B2

(12) United States Patent
Xu et al.

(10) Patent No.: US 9,786,500 B2
(45) Date of Patent: Oct. 10, 2017

(54) POLYCRYSTALLINE SEMICONDUCTOR LAYER AND FABRICATING METHOD THEREOF

(71) Applicant: BOE TECHNOLOGY GROUP CO., LTD., Beijing (CN)

(72) Inventors: Wenqing Xu, Beijing (CN); Hongwei Tian, Beijing (CN); Chunping Long, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/038,350

(22) PCT Filed: Dec. 28, 2015

(86) PCT No.: PCT/CN2015/099239
§ 371 (c)(1),
(2) Date: May 20, 2016

(87) PCT Pub. No.: WO2016/184114
PCT Pub. Date: Nov. 24, 2016

(65) Prior Publication Data
US 2017/0103890 A1    Apr. 13, 2017

(30) Foreign Application Priority Data

May 15, 2015    (CN) .......................... 2015 1 0250931

(51) Int. Cl.
*H01L 21/02* (2006.01)
*H01L 29/66* (2006.01)
(Continued)

(52) U.S. Cl.
CPC ........ *H01L 21/02686* (2013.01); *C30B 1/023* (2013.01); *C30B 28/02* (2013.01);
(Continued)

(58) Field of Classification Search
CPC ......... H01L 21/02686; H01L 29/78696; H01L 21/02592; H01L 29/6675; H01L 29/78672;
(Continued)

(56) References Cited

U.S. PATENT DOCUMENTS 6,608,326 B1 *  8/2003  Shinagawa ......... H01L 21/2026
                                                          257/347
2008/0064195 A1 *  3/2008  Kim .................. H01L 21/28273
                                                          438/591
(Continued)

FOREIGN PATENT DOCUMENTS

CN    101521201 A    9/2009
CN    104934372 A    9/2015

OTHER PUBLICATIONS

International Search Report & Written Opinion dated Mar. 31, 2016 regarding PCT/CN2015/099239.

*Primary Examiner* — Fernando L Toledo
*Assistant Examiner* — Adam S Bowen
(74) *Attorney, Agent, or Firm* — Intellectual valley law, P.C.

(57) ABSTRACT

The present application discloses a method of fabricating a polycrystalline semiconductor layer, comprising forming a heat storage layer; forming a buffer layer on the heat storage layer; forming a first amorphous semiconductor layer on a side of the buffer layer distal to the heat storage layer; and crystallizing the first amorphous semiconductor layer to form a first polycrystalline semiconductor layer.

20 Claims, 2 Drawing Sheets

(51) Int. Cl.
*H01L 29/786* (2006.01)
*H01L 27/12* (2006.01)
*C30B 1/02* (2006.01)
*C30B 28/02* (2006.01)
*C30B 29/06* (2006.01)

(52) U.S. Cl.
CPC ........ C30B 29/06 (2013.01); H01L 21/02532 (2013.01); H01L 21/02592 (2013.01); H01L 27/1222 (2013.01); H01L 27/1285 (2013.01); H01L 29/6675 (2013.01); H01L 29/78672 (2013.01); H01L 29/78696 (2013.01)

(58) Field of Classification Search
CPC ........... H01L 21/02532; H01L 27/1222; H01L 27/1285; C30B 1/023; C30B 28/02; C30B 29/06
USPC .......................................................... 257/64
See application file for complete search history.

(56) References Cited

U.S. PATENT DOCUMENTS

2011/0241005 A1* 10/2011 Ro .................... G02F 1/136209
                                                        257/59
2014/0065804 A1* 3/2014 Tian ........................ C23C 16/24
                                                        438/487
2014/0357065 A1* 12/2014 Wang ................ H01L 21/02595
                                                        438/487

* cited by examiner

POLYCRYSTALLINE SEMICONDUCTOR LAYER AND FABRICATING METHOD THEREOF

CROSS-REFERENCE TO RELATED APPLICATION

This application is a national stage application under 35 U.S.C. §371 of International Application No. PCT/CN2015/099239 filed Dec. 28, 2015, which claims priority to Chinese Patent Application No. 201510250931.1, filed May 15, 2015, the contents of which are incorporated by reference in the entirety.

FIELD

The present invention relates to display technology, more particularly, to a polycrystalline semiconductor layer and a fabricating method thereof.

BACKGROUND

One of the most important factor affecting the electronic properties of a display panel is the mobility rate of its semiconductor material. Polysilicon has a higher mobility rate and stability than amorphous silicon. A low temperature polysilicon (LTPS) organic light emitting display (PLED) panel has the advantage of being energy efficient, ultrathin, and capable of self-emitting. Development of a new generation of LTPS OLED has become the focus of research in display technology.

SUMMARY

In one aspect, the present disclosure provides a method of fabricating a polycrystalline semiconductor layer, comprising forming a heat storage layer; forming a buffer layer on the heat storage layer; forming a first amorphous semiconductor layer on a side of the buffer layer distal to the heat storage layer; and crystallizing the first amorphous semiconductor layer to form a first polycrystalline semiconductor layer.

Optionally, the first amorphous semiconductor layer comprises amorphous silicon, and the first polycrystalline semiconductor layer comprises polysilicon.

Optionally, the crystallizing step is performed using excimer laser annealing.

Optionally, the heat storage layer is a second amorphous semiconductor layer.

Optionally, the second amorphous semiconductor layer comprises amorphous silicon.

Optionally, the excimer laser annealing is performed under the following conditions: a laser pulse frequency of about 100 Hz to about 400 Hz, an overlapping ratio of about 90% to about 98%, a laser pulse width less than 100 ns, and a laser energy density of about 100 $mJ/cm^2$ to about 600 $mJ/cm^2$.

Optionally, the thickness of the first amorphous semiconductor layer is in the range of about 40 nm to about 60 nm.

Optionally, the thickness of the heat storage layer is in the range of about 20 nm to about 30 nm.

Optionally, the thickness of the buffer layer is in the range of about 2000 Å to about 5000 Å.

Optionally, the method further comprises dehydrogenating the first amorphous semiconductor layer prior to the step of crystallizing the first amorphous semiconductor layer.

Optionally, the method further comprises forming an ancillary buffer layer.

Optionally, the heat storage layer is formed on a side of the ancillary buffer layer proximal to the buffer layer.

Optionally, the thickness of the ancillary buffer layer is in the range of about 2000 Å to about 5000 Å.

Optionally, the method further comprises providing a base substrate, wherein the heat storage layer is formed on the base substrate.

In another aspect, the present disclosure provides a polycrystalline semiconductor layer fabricated by a method described herein.

In another aspect, the present disclosure also provides a thin film transistor fabricated from a polycrystalline semiconductor layer.

In another aspect, the present disclosure also provides an array substrate comprising a thin film transistor described herein.

In another aspect, the present disclosure also provides a display device comprising an array substrate described herein.

In another aspect, the present disclosure further provides a semiconductor device comprising a first polycrystalline semiconductor layer, a second polycrystalline semiconductor layer, and a buffer layer sandwiched by the first polycrystalline semiconductor layer and the second polycrystalline semiconductor layer; wherein the first polycrystalline semiconductor layer having an average grain size of no less than 375 nm.

Optionally, the first polycrystalline semiconductor layer having an average grain size of no less than 375 nm.

Optionally, the semiconductor device further comprises an ancillary buffer layer on a side of the second polycrystalline semiconductor layer distal to the buffer layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
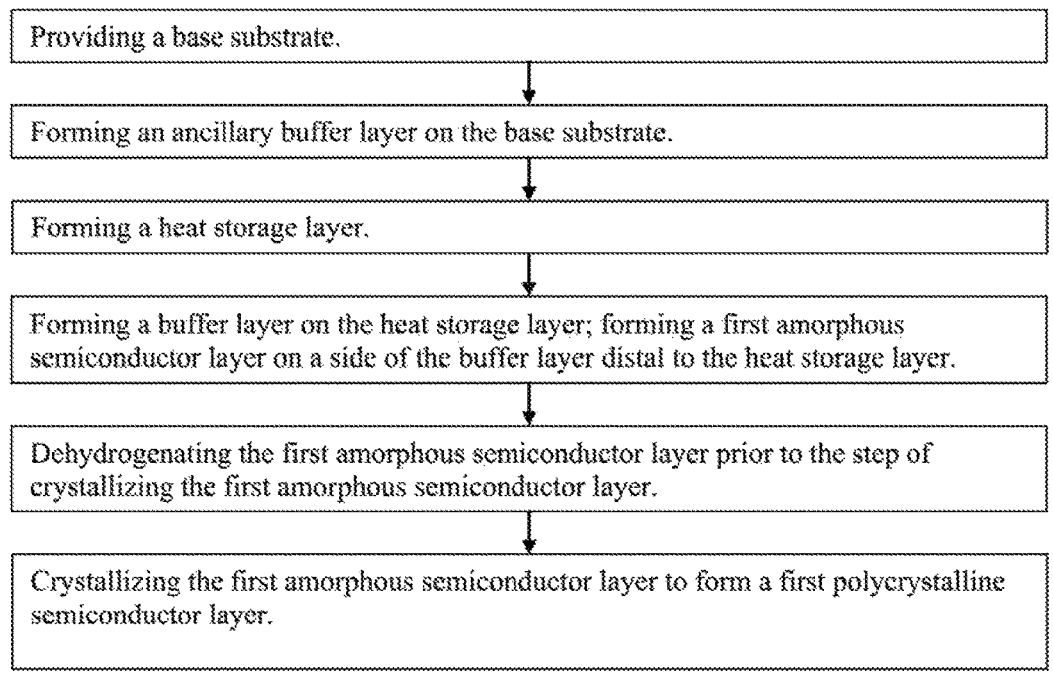
FIG. 1 is a flow chart illustrating a method of fabricating a polycrystalline semiconductor layer in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure provides a method of fabricating a polycrystalline semiconductor layer, e.g., a polycrystalline semiconductor thin film. In some embodiments, in addition to an amorphous semiconductor layer that is to be converted into a polycrystalline semiconductor layer, a heat storage layer is formed on a base substrate. For example, the first amorphous semiconductor layer may be crystallized to form a polycrystalline semiconductor layer. During the crystallization process, the first amorphous semiconductor layer and the heat storage layer absorb and release heat around the same time (e.g., in synchronization with each other). Due to the heat released by the heat storage layer, the cooling period of the first amorphous semiconductor layer is extended, correspondingly the crystal growth period of the first amorphous semiconductor layer is extended. As a result, a bigger grain size of the polycrystalline particles can be obtained. For example, an average grain size of no less than 350 nm, e.g., no less than 355 nm, no less than 365 nm, no less than 375 nm, no less than 385 nm, no less than 395 nm, or no less than 400 nm may be achieved. Optionally, a buffer layer may be formed on a side of the heat storage layer distal to the base substrate, and the first amorphous semiconductor layer is formed on a side of the buffer layer distal to the heat storage layer.

In some embodiments, the method of fabricating a polycrystalline semiconductor layer includes forming a heat storage layer; forming a buffer layer on the heat storage layer; forming a first amorphous semiconductor layer on a side of the buffer layer distal to the heat storage layer; and crystallizing the first amorphous semiconductor layer to form a first polycrystalline semiconductor layer.

The method is suitable for fabricating any appropriate type of polycrystalline semiconductor, i.e., the first amorphous semiconductor layer may be any appropriate type of semiconductor layer. For example, the first amorphous semiconductor layer can be an amorphous silicon layer or an amorphous selenium layer. Optionally, the first amorphous semiconductor layer comprises amorphous silicon, and the first polycrystalline semiconductor layer comprises polysilicon. In some embodiments, the thickness of the first amorphous semiconductor layer is in the range of about 40 nm to about 60 nm, e.g., of about 40 nm to about 45 nm, of about 45 nm to about 50 nm, of about 50 nm to about 55 nm, or of about 55 nm to about 60 nm.

The heat storage layer may be made of any appropriate type of material so long as it can function as a heat absorption and release layer facilitating the formation of the polycrystalline semiconductor layer. For example, the heat storage layer can be made of a material having thermal properties similar to those of the first amorphous semiconductor layer. In some embodiments, the heat storage layer can be a second amorphous semiconductor layer. Optionally, the second amorphous semiconductor layer can be of the same type amorphous semiconductor material as the first amorphous semiconductor layer. Optionally, the second amorphous semiconductor layer can be an amorphous silicon layer or an amorphous selenium layer. Optionally, the second amorphous semiconductor layer comprises amorphous silicon. Optionally, the thickness of the heat storage layer is in the range of about 20 nm to about 30 nm, about 20 nm to about 25 nm, or about 25 nm to about 30 nm.

The buffer layer may be made of any appropriate material. For example, the buffer layer can include silicon oxide and/or silicon nitride. Optionally, the thickness of the buffer layer is in the range of about 2000 Å to about 5000 Å e.g., about 2000 Å to about 3000 Å, about 3000 Å to about 4000 Å, or about 4000 Å to about 5000 Å.

In some embodiments, the method of fabricating a polycrystalline semiconductor layer further includes forming an ancillary buffer layer, wherein the heat storage layer is formed on a side of the ancillary buffer layer proximal to the buffer layer. The ancillary buffer layer may be made of any appropriate material. For example, the ancillary buffer layer can include silicon oxide and/or silicon nitride. Optionally, the thickness of the buffer layer is in the range of about 2000 Å to about 5000 Å e.g., about 2000 Å to about 3000 Å, about 3000 Å to about 4000 Å, or about 4000 Å to about 5000 Å.

The crystallization step may be performed utilizing any appropriate crystallization method. In some embodiments, the crystallization step is performed utilizing a method selected from the group consisting of excimer laser annealing (ELA), solid phase crystallization (SPC), sequential lateral solidification (SLS), metal induced crystallization (MIC), and metal-induced lateral crystallization (MILC). Optionally, the crystallization step is performed using excimer laser annealing.

During the crystallization, the first amorphous semiconductor layer and the heat storage layer absorb and release heat around the same time (e.g., in synchronization with each other). For example, when the laser pulse is applied on the base substrate having the first amorphous semiconductor layer, the first amorphous semiconductor layer and the heat storage layer both absorb heat generated by the laser pulse. When the laser pulse is no longer applied to the base substrate, the first amorphous semiconductor layer and the heat storage layer both release heat. Due to the heat released by the heat storage layer, the cooling period of the first amorphous semiconductor layer is extended, correspondingly the crystal growth period of the first amorphous semiconductor layer is extended. As a result, a bigger grain size of the polycrystalline particles can be obtained. Optionally, the excimer laser annealing is performed under the following conditions: a laser pulse frequency of about 100 Hz to about 400 Hz, an overlapping ratio of about 90% to about 98%, a laser pulse width less than 100 ns, and a laser energy density of about 100 $mJ/cm^2$ to about 600 $mJ/cm^2$.

In some embodiments, the method of fabricating a polycrystalline semiconductor layer further includes dehydrogenating the first amorphous semiconductor layer prior to the step of crystallizing the first amorphous semiconductor layer. In some embodiments, the method of fabricating a polycrystalline semiconductor layer further includes providing a base substrate, wherein the heat storage layer is formed on the base substrate.

FIG. 1 is a flow chart illustrating a method of fabricating a polycrystalline semiconductor layer in some embodiments. Referring to FIG. 1 the method in the embodiment includes providing a base substrate. The base substrate may be made of any appropriate material, such as glass, quartz, metal, or a flexible material. Optionally, the base substrate is an ultrathin base substrate for making a transparent substrate.

Figure 2:
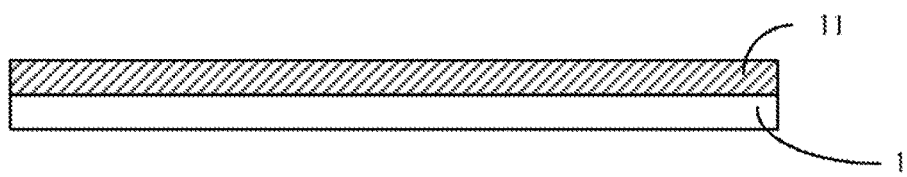
FIG. 2 is a diagram illustrating the structure of a base substrate having an ancillary buffer layer in some embodiments.

Optionally, the method in the embodiment includes forming an ancillary buffer layer on the base substrate. A pre-cleaning procedure may be used to remove contaminants from the surface of the base substrate prior to deposition of the ancillary buffer layer. FIG. 2 is a diagram illustrating the structure of a base substrate having an ancillary buffer layer in some embodiments. As shown in FIG. 2, the ancillary buffer layer 11 is coated to the base substrate 1 to cover the entire base substrate 1.

The ancillary buffer layer enhances the adhesion between the heat storage layer and the base substrate. Having an ancillary buffer layer also prevents contamination of the polycrystalline semiconductor material caused by diffusion of metal ions in the base substrate into the polycrystalline semiconductor layer. It also reduce current leakage in the thin film transistor having the polycrystalline semiconductor layer.

In some embodiments, the ancillary buffer layer is coated on the base substrate using a Plasma-Enhanced Chemical Vapor Deposition (PECVD) method. Optionally, the ancillary buffer layer includes a single layer silicon oxide ($SiO_x$), a single layer silicon nitride ($SiN_x$), or a combination of a silicon oxide layer and a silicon nitride layer. Optionally, the ancillary buffer layer has a thickness in the range of about 2000 Å to about 5000 Å.

Optionally, the silicon nitride layer may be formed using a reaction gas mixture having $SiH_4$, $NH_3$, and $N_2$, or a reaction gas mixture having $SiH_2Cl_2$, $NH_2$, and $N_2$. Optionally, the silicon oxide layer may be formed using a reaction gas mixture having $SiH_4$, $NH_3$, and $O_2$, or a reaction gas mixture having $SiH_2Cl_2$, $NH_2$, and $O_2$.

Figure 3:
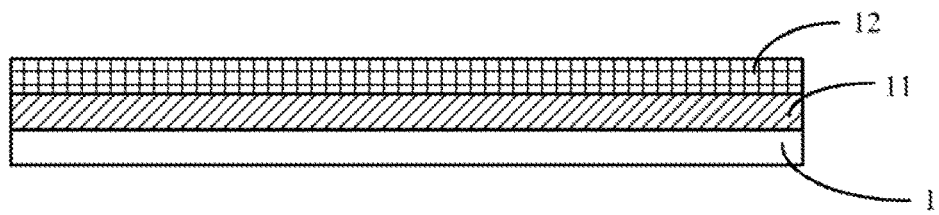
FIG. 3 is a diagram illustrating the structure of a base substrate having a heat storage layer in some embodiments.

The method in the embodiment includes forming a heat storage layer. FIG. 3 is a diagram illustrating the structure of a base substrate having a heat storage layer in some embodiments. As shown in FIG. 3, a heat storage layer 12 is coated on the ancillary buffer layer 11. As discussed above, the function of the heat storage layer is to facilitate the formation of a polycrystalline semiconductor layer. Optionally, the heat storage layer is a second amorphous semiconductor layer (e.g., a second amorphous silicon layer). Optionally, the heat storage layer has a thickness in the range of about 20 nm to about 30 nm. Optionally, the second amorphous silicon may be formed using a reaction vas mixture having $SiH_4$ and $H_2$, or a reaction gas mixture having $SiH_2Cl_2$ and $H_2$.

Figure 4:
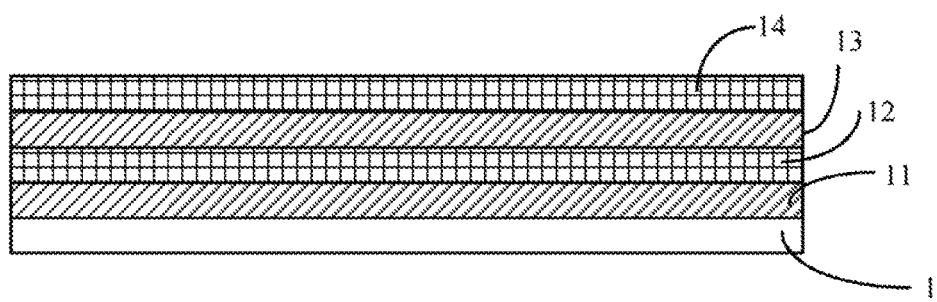
FIG. 4 is a diagram illustrating the structure of a base substrate having a buffer layer and a first amorphous semiconductor layer in some embodiments.

The method in the embodiment also includes forming a buffer layer on the heat storage layer; forming a first amorphous semiconductor layer on a side of the buffer layer distal to the heat storage layer. FIG. 4 is a diagram illustrating the structure of a base substrate having a buffer layer and a first amorphous semiconductor layer in some embodiments. As shown in FIG. 4, a buffer layer 13 is coated on the heat storage layer 12, and a first amorphous semiconductor layer 14 is coated on the buffer layer 13. Optionally, the buffer layer has a thickness in the range of about 2000 Å to about 5000 Å. Optionally, the first amorphous semiconductor layer has a thickness in the range of about 40 nm to about 60 nm. Optionally, the buffer layer and the ancillary buffer layer are made of a same material. Optionally, the buffer layer and the ancillary buffer layer are made of different materials. Optionally, the first amorphous silicon may be formed using a reaction gas mixture having $SiH_4$ and $H_2$, or a reaction gas mixture having $SiH_2Cl_2$ and $H_2$. The first amorphous semiconductor layer and the second amorphous semiconductor layer may be made of a same material (e.g., amorphous silicon) or different materials.

Optionally, the method in the embodiment also includes dehydrogenating the first amorphous semiconductor layer prior to the step of crystallizing the first amorphous semiconductor layer. The purpose of the dehydrogenation process is to reduce or eliminate hydrogen contents in the first amorphous semiconductor layer. This prevents the occurrence of hydrogen explosion during the crystallization step.

In some embodiments, the dehydrogenation step is performing using a thermal annealing method. The temperature for the thermal annealing process can be determined based on several factors, including the material used for making the base substrate. For example, the thermal annealing temperature can be relatively higher when using a glass base substrate as compared to the thermal annealing temperature suitable for a flexible base substrate. Optionally, the thermal annealing is performed in a chamber having nitrogen gas as the ambient atmosphere. Optionally, the thermal annealing temperature is in the range of about 400° C. to about 500° C.

The method in the embodiment also includes crystallizing the first amorphous semiconductor layer to form a first polycrystalline semiconductor layer. In some embodiments, the crystallization process is performed using an excimer laser annealing method.

The excimer laser annealing is a method of fabricating a polycrystalline semiconductor layer at a low temperature. The excimer laser crystallizes an amorphous semiconductor layer by radiating a high energy laser beam onto the amorphous semiconductor layer for a time of tens of nanoseconds. This results in a localized and limited thermal effect within a depth of about 100 nm, heating the amorphous semiconductor layer to a temperature up to about 1000° C. and converting the amorphous semiconductor to a polycrystalline form. In this method, the amorphous silicon is melted and crystallized in a very short moment, so that the glass substrate is not damaged at all. During a laser pulse of about 15 ns to about 50 ns, the energy is absorbed by the amorphous semiconductor layer, and used for phase transition of the amorphous semiconductor material. The amount of heat transferred to the base substrate is limited. By choosing appropriate laser wavelength and power, the method can be applied to melt and crystallize the amorphous semiconductor layer, but not the underlying base substrate.

Specifically, in some methods, a laser pulse is applied to the surface of the amorphous semiconductor layer to melt the amorphous semiconductor layer to a point where the energy density is above the crystallization threshold of the semiconductor material. The semiconductor material absorbs energy induced by the laser pulse, resulting in unbalanced electron-hole pair production and increased conductivity of free electrons. Within the thermalization time, the electron-hole pairs transfer the absorbed energy to the crystal lattice in a non-radiative recombination process, causing a rapid temperature increase on the surface of the amorphous semiconductor layer. Due to the existence of abundant gap states and deep level states in the amorphous semiconductor material, the majority of the recombination process is of the non-radiative transition type, which leads to a high photothermal transduction efficiency. When laser energy density reaches above the threshold energy density, i.e., the melting temperature, the surface of the amorphous semiconductor layer begins to melt. The melting travels toward the internal portion of the amorphous semiconductor layer at a speed of about 10 m/s. When the laser pulse is on, a melting layer of a certain depth is formed on the amorphous semiconductor layer. When the laser pulse is off, the melting layer rapidly cools down. The solid-liquid interface travels back to the surface of the amorphous semiconductor layer at a speed of about 1-2 m/s. The amorphous semiconductor layer crystallizes into a polycrystalline semiconductor layer during the cooling process.

A larger crystal size in the polycrystalline semiconductor layer will result in a larger mobility rate and better electronic properties. Typically, a laser with a larger energy density can produce a larger crystal size and a corresponding larger mobility rate. For example, the crystal size may be maximized when nearly entire amorphous semiconductor layer is melted. However, the laser energy density is limited by power of laser generator. Also, the mobility rate is observed to decrease when the laser energy density is over a certain limit. Accordingly, the present disclosure provides a better method for increasing crystal size, by increasing the crystal growth period of the polycrystalline semiconductor. Specifically, the present disclosure in some embodiments provides a method in which a heat storage layer is used for extending the crystal growth period. In some embodiments, in addition to an amorphous semiconductor layer that is to be converted into a polycrystalline semiconductor layer, a heat storage layer is formed on a base substrate.

Figure 5:
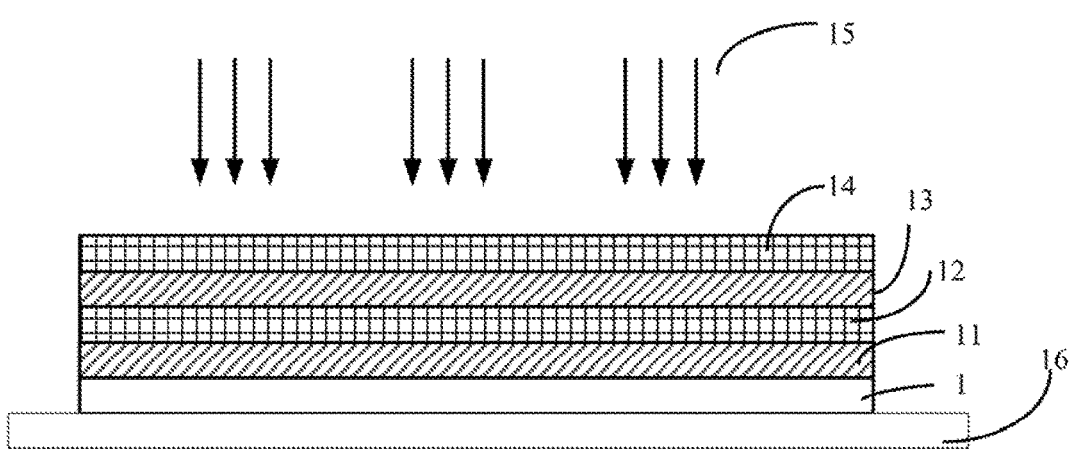
FIG. 5 is a diagram illustrating a process of excimer laser annealing a first amorphous semiconductor layer in some embodiments.

FIG. 5 is a diagram illustrating a process of excimer laser annealing a first amorphous semiconductor layer in some embodiments. As shown in FIG. 5, during the excimer laser annealing process, the laser beam 15 is fixed at a certain position. The base substrate having the heat storage layer and the first amorphous semiconductor layer are secured to a translation stage 16. The excimer laser annealing process may be conducted in a chamber. The laser beam 15 scans through predetermined positions of the base substrate (e.g., the entire base substrate) by moving the base substrate on the translation stage 16. Upon the application of the laser beam 15, the first amorphous semiconductor layer 14 absorbs energy and start melting. The heat storage layer 12 also starts melting by absorbing the laser energy passing through the first amorphous semiconductor layer 14 and the buffer layer 13 as well as the thermal energy released by the melted first amorphous semiconductor layer 14.

Optionally, the thickness of the heat storage layer 12 is larger than 20 nm. As discussed above, the heat storage layer 12 absorbs the laser energy passing through the first amorphous semiconductor layer 14 and the buffer layer 13 as well as the thermal energy released by the melted first amorphous semiconductor layer 14. Based on energy absorption and utilization efficiency, the thickness of the heat storage layer 12 can be determined.

Optionally, the thickness of the heat storage layer 12 is less than 30 nm. Typically, the melting and solidification of the heat storage layer 12 will produce protrusions between neighboring crystals, the height of which is about the same as the thickness of the heat storage layer 12. To ensure that the polycrystalline semiconductor layer forms on a smooth underlying surface, the surface roughness of the heat storage layer 12 is kept within a limit. For example, the height of the protrusions may be kept less than 30 nm. Accordingly, in some embodiments, the thickness of the heat storage layer 12 is in the range of about 20 nm to about 30 nm.

When the laser beam 15 is no longer applied to the first amorphous semiconductor layer 14, the cooling process starts. The surface of the first amorphous semiconductor layer 14 cools down first and converts into the low-temperature polycrystalline form. Around the same time, the cooling and solidification process in the heat storage layer 12 also starts, during which the heat storage layer 12 releases a certain amount of heat. The released heat is transferred to the first amorphous semiconductor layer 14 through the buffer layer 13. The released heat extends the cooling period and crystal growth period of the first amorphous semiconductor layer 14, resulting in a low-temperature polycrystalline form having a larger crystal size.

In some embodiments, the method includes forming more than one heat storage layers. Optionally, the thickness of the more than one heat storage layers is kept about the same as that of the single heat storage layer in embodiments having only one heat storage layer.

Any appropriate laser generator may be used for generating the laser beam, including, but are not limited to, XeCl excimer laser generator. KrF excimer laser generator, and ArF excimer laser generator. Optionally, the laser has a wavelength of about 308 nm. Optionally, the generated laser is converted into a linear light source using an optical system.

Optionally, the excimer laser annealing is performed under the following conditions: a laser pulse frequency of about 100 Hz to about 400 Hz, an overlapping ratio of about 90% to about 98%, a laser pulse width less than 100 ns, and a laser energy density of about 100 $mJ/cm^2$ to about 600 $mJ/cm^2$.

In another aspect, the present disclosure provides a polycrystalline semiconductor layer fabricated by a method described herein, and a thin film transistor fabricated from the polycrystalline semiconductor layer. The present disclosure also provides an array substrate having the thin film transistor described herein.

In another aspect, the present disclosure further provides a display device having the array substrate described herein. The display device may be of any appropriate type. For example, the display device may be a liquid crystal display panel, a mobile phone, a tablet computer, a television, a monitor, a notebook computer, a digital picture frame, a navigation system, etc.

In another aspect, the present disclosure further provides a semiconductor device including a first polycrystalline semiconductor layer having an average grain size of no less than 350 nm, e.g., no less than 355 nm, no less than 365 nm, no less than 375 nm, no less than 385 nm, no less than 395 nm, or no less than 400 nm. Optionally, a mobility rate of the polycrystalline semiconductor layer is improved by more than 5%, e.g., more than 10%, more than 15%, more titan 20%, mores than 25%, more than 30%, or more than 35%, as compared to a conventional polycrystalline semiconductor layer, in some embodiments, the semiconductor device includes a first polycrystalline semiconductor layer, a second polycrystalline semiconductor layer, and a buffer layer sandwiched by the first polycrystalline semiconductor layer and the second polycrystalline semiconductor layer. Optionally, the semiconductor device further includes an ancillary buffer layer on a side of the second polycrystalline semiconductor layer distal to the buffer layer. Optionally, the semiconductor device is a display device. Optionally, the display device includes an array substrate having the first polycrystalline semiconductor layer. Optionally, the array substrate includes a thin film transistor, the thin film transistor includes or is made from the first polycrystalline semiconductor layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a polycrystalline semiconductor layer, comprising:
   forming a heat storage layer;
   forming a buffer layer on the heat storage layer;
   forming a first amorphous semiconductor layer on a side of the buffer layer distal to the heat storage layer; and
   crystallizing the first amorphous semiconductor layer to form a first polycrystalline semiconductor layer;
   wherein crystallizing the first amorphous semiconductor layer comprises at least partially melting both the first amorphous semiconductor layer and the heat storage layer in a single crystallization process; and
   solidifying both the first amorphous semiconductor layer and the heat storage layer.

2. The method of claim 1, wherein the first amorphous semiconductor layer comprises amorphous silicon, and the first polycrystalline semiconductor layer comprises polysilicon.

3. The method of claim 1, wherein the crystallizing step is performed using excimer laser annealing.

4. The method of claim 1, wherein the heat storage layer is a second amorphous semiconductor layer; and
   the heat storage layer is at least partially crystallized during solidifying.

5. The method of claim 4, wherein the second amorphous semiconductor layer comprises amorphous silicon.

6. The method of claim 3, wherein the excimer laser annealing is performed under the following conditions: a laser pulse frequency of about 100 Hz to about 400 Hz, an overlapping ratio of about 90% to about 98%, a laser pulse width less than 100 ns, and a laser energy density of about 100 mJ/cm² to about 600 mJ/cm².

7. The method of claim 2, wherein the thickness of the first amorphous semiconductor layer is in the range of about 40 nm to about 60 nm.

8. The method of claim 4, wherein the thickness of the heat storage layer is in the range of about 20 nm to about 30 nm.

9. The method of claim 1, wherein the thickness of the buffer layer is in the range of about 2000 Å to about 5000 Å.

10. The method of claim 1, further comprising:
    dehydrogenating the first amorphous semiconductor layer prior to the step of crystallizing the first amorphous semiconductor layer.

11. The method of claim 1, further comprising:
    forming an ancillary buffer layer;
    wherein the heat storage layer is formed on a side of the ancillary buffer layer proximal to the buffer layer.

12. The method of claim 11, wherein the thickness of the ancillary buffer layer is in the range of about 2000 Å to about 5000 Å.

13. The method of claim 1, further comprising providing a base substrate, wherein the heat storage layer is formed on the base substrate.

14. A polycrystalline semiconductor layer fabricated by a method of claim 1.

15. A thin film transistor fabricated from a polycrystalline semiconductor layer of claim 14.

16. An array substrate comprising a thin film transistor of claim 15.

17. A display device comprising an array substrate of claim 16.

18. The method of claim 4, wherein protrusions are formed between neighboring crystals of the heat storage layer during melting and solidifying of the heat storage layer; and
    heights of the protrusions are approximately the same as a thickness of the heat storage layer.

19. A semiconductor device comprising a first polycrystalline semiconductor layer, a second polycrystalline semiconductor layer, and a buffer layer sandwiched by the first polycrystalline semiconductor layer and the second polycrystalline semiconductor layer; wherein the first polycrystalline semiconductor layer having an average grain size of no less than 375 nm; and the second polycrystalline semiconductor layer comprises protrusions between neighboring crystals, the heights of which are approximately the same as the thickness of the second polycrystalline semiconductor layer.

20. The semiconductor device of claim 19, wherein the thickness of the second polycrystalline semiconductor layer is in the range of about 20 nm to about 30 nm.

* * * * *